United States Patent
Ko et al.

(10) Patent No.: US 8,525,526 B2
(45) Date of Patent: Sep. 3, 2013

(54) HIGH VOLTAGE TEST TERMINAL HAVING A SHOCK-ABSORBING INSULATOR

(75) Inventors: Chungduck Ko, Mendon, NY (US);
Pete G. Schultz, LeRoy, NY (US);
Andrew V. McNulty, Batavia, NY (US);
Eric R. Weatherbee, Attica, NY (US);
Shibao Zhang, Rochester, NY (US)

(73) Assignee: Hubbell Incorporated, Shelton, CT (US)

( * ) Notice: Subject to any disclaimer, the term of this patent is extended or adjusted under 35 U.S.C. 154(b) by 404 days.

(21) Appl. No.: 12/618,548

(22) Filed: Nov. 13, 2009

(65) Prior Publication Data
US 2011/0115465 A1    May 19, 2011

(51) Int. Cl.
*H01H 31/12*    (2006.01)
*H01R 39/00*    (2006.01)

(52) U.S. Cl.
USPC ............................................. 324/552; 439/31

(58) Field of Classification Search
USPC .................... 324/552; 439/31, 151
See application file for complete search history.

(56) References Cited

U.S. PATENT DOCUMENTS

| | | | |
|---|---|---|---|
| 2,333,532 A | 11/1943 | Frakes et al. | |
| 2,679,026 A | 5/1954 | Frakes | |
| 2,802,176 A | 8/1957 | Anderson et al. | |
| 3,363,172 A | 1/1968 | Doble | |
| 4,237,415 A | 12/1980 | Easley | |
| 4,268,222 A * | 5/1981 | Bernard | 416/1 |
| 4,543,523 A | 9/1985 | Moran | |
| 4,937,406 A * | 6/1990 | Toshima | 218/46 |
| 5,073,764 A * | 12/1991 | Takahashi et al. | 335/16 |
| 5,418,467 A * | 5/1995 | Floch et al. | 324/671 |
| 5,523,674 A * | 6/1996 | Dohnal et al. | 323/340 |
| 6,972,378 B2 | 12/2005 | Schomer et al. | |
| 7,084,210 B2 * | 8/2006 | Eagle | 525/119 |
| 7,138,897 B2 * | 11/2006 | Minerbo et al. | 336/90 |
| 7,262,367 B2 | 8/2007 | Donzel et al. | |
| 7,541,901 B2 * | 6/2009 | Nakano et al. | 335/201 |
| 7,902,948 B2 * | 3/2011 | Luders | 335/201 |
| 7,913,591 B2 * | 3/2011 | Nenadic | 81/427.5 |
| 2008/0100299 A1 * | 5/2008 | Phillips et al. | 324/439 |

FOREIGN PATENT DOCUMENTS

JP        59198362        11/1984

* cited by examiner

*Primary Examiner* — Jeff Natalini
(74) *Attorney, Agent, or Firm* — Marcus R. Mickney; Mark S. Bicks; Alfred N. Goodman (57) ABSTRACT

A high voltage test terminal for an electrical power distribution/transmission system includes a shock-absorbing insulator disposed between first and second conductors. A blade is movably connected to the second conductor. The blade is electrically and mechanically connected to the first conductor in a first position and electrically isolated and mechanically disconnected from the first conductor in a second position. The blade is in the first position for normal operation of the electrical apparatus. The blade of the test terminal is moved to the second open position to conduct both electrical and mechanical tests of the electrical apparatus.

25 Claims, 6 Drawing Sheets

HIGH VOLTAGE TEST TERMINAL HAVING A SHOCK-ABSORBING INSULATOR

FIELD OF THE INVENTION

The present invention relates to a high voltage test terminal in which both electrical and mechanical tests are conducted with the blade in the open position. More particularly, the present invention relates to a high voltage test terminal having a shock-absorbing insulator disposed between the electrical conductors.

BACKGROUND OF THE INVENTION

Test terminals are used to perform field tests of electrical apparatus. For example, test terminals are used to conduct dielectric tests of substation equipment, such as transformers and circuit breakers. Properly testing electrical apparatus extends the service life of the electrical apparatus and facilitates preventing apparatus failure, which results in expensive downtime, lost revenue and costly apparatus repair and replacement.

The test terminal is disposed in an electrical distribution/transmission system between a high voltage power bus and the electrical apparatus to be tested. In the closed position, the test terminal allows electrical power to be transferred from the power bus to the electrical apparatus. When the test terminal is in an open position, the electrical apparatus is electrically isolated from the power bus such that electrical tests of the electrical apparatus can be conducted.

However, to conduct a mechanical test of the electrical apparatus, such as time travel testing of circuit breakers, requires the test terminal to be in the closed position. Thus, the mechanical test is performed with the test terminal in the closed position and the electrical test is performed with the test terminal in the open position. Moving the test terminal between open and closed positions increases the time required to conduct the tests. Accordingly, a need exists for a test terminal that minimizes the time to conduct the electrical and mechanical field tests of electrical apparatus by conducting both tests with the test terminal in the open position.

Additionally, the test terminal needs to be in the closed position to protect the test terminal from possible damage resulting from the mechanical testing of the electrical apparatus, such as damage from shock or vibration. Accordingly, a need exists for a test terminal that substantially eliminates damage resulting from mechanical testing of electrical apparatus.

Furthermore, the mechanical test is performed with the test terminal in the closed position such that the electrical apparatus being tested is not electrically isolated, thereby posing dangerous testing conditions. Accordingly, a need exists for a test terminal in which the electrical apparatus being mechanically tested is electrically isolated from the power distribution/transmission system.

Thus, there is a continuing need to provide improved high voltage test terminals for field electrical and mechanical testing of electrical apparatus.

SUMMARY OF THE INVENTION

Accordingly, it is a primary objective of the present invention to provide an improved high voltage test terminal for field testing of electrical apparatus.

A further objective of the present invention is to provide an improved high voltage test terminal in which field electrical and mechanical testing is conducted with the test terminal in an open position.

Another objective of the present invention is to provide a high-voltage test terminal having a shock-absorbing insulator.

The foregoing objectives are basically attained by a high voltage test terminal for an electrical power distribution/transmission system. A shock-absorbing insulator is disposed between first and second conductors. A blade is movably connected to the second conductor. The blade is electrically and mechanically connected to the first conductor in a first position and electrically isolated and mechanically disconnected from the first conductor in a second position.

The foregoing objectives are also basically attained by a method of field testing an electrical apparatus. A test terminal is connected between a high voltage bus and an electrical apparatus to be field tested. A blade of the test terminal is positioned in a closed position for normal operation of the electrical apparatus. The blades of the test terminal are moved to an open position to electrically isolate the electrical apparatus from the high voltage bus. Both the electrical and mechanical tests of the electrical apparatus are conducted after moving the blades to the open position.

Other objects, advantages and salient features of the invention will become apparent from the following detailed description, which, taken in conjunction with the annexed drawings, discloses a preferred embodiment of the invention.

As used in this application, the terms "front," "rear," "upper," "lower," "upwardly," "downwardly," and other orientational descriptors are intended to facilitate the description of the high-voltage test terminal, and are not intended to limit the structure of the high voltage test terminal to any particular position or orientation.

BRIEF DESCRIPTION OF THE DRAWINGS

The above aspects and features of the present invention will be more apparent from the description for an exemplary embodiment of the present invention taken with reference to the accompanying drawings, in which.

Throughout the drawings, like reference numerals will be understood to refer to like parts, components and structures.

DETAILED DESCRIPTION OF EXEMPLARY EMBODIMENTS

Figure 1:
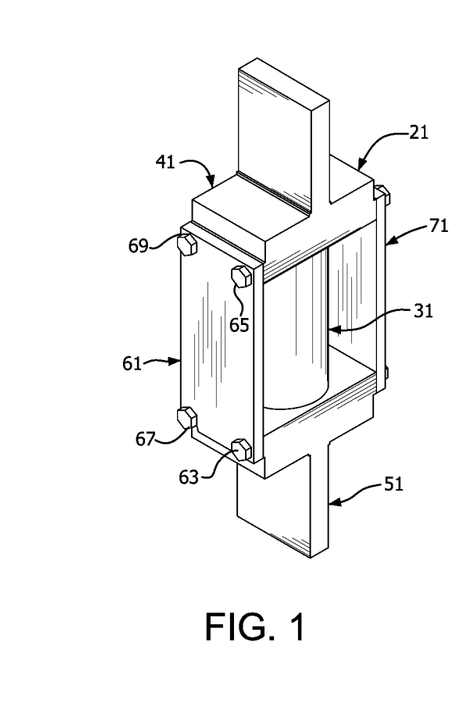
FIG. 1 is a perspective view of a high voltage test terminal according to a first exemplary embodiment of the present invention in a closed position.
Figure 2:
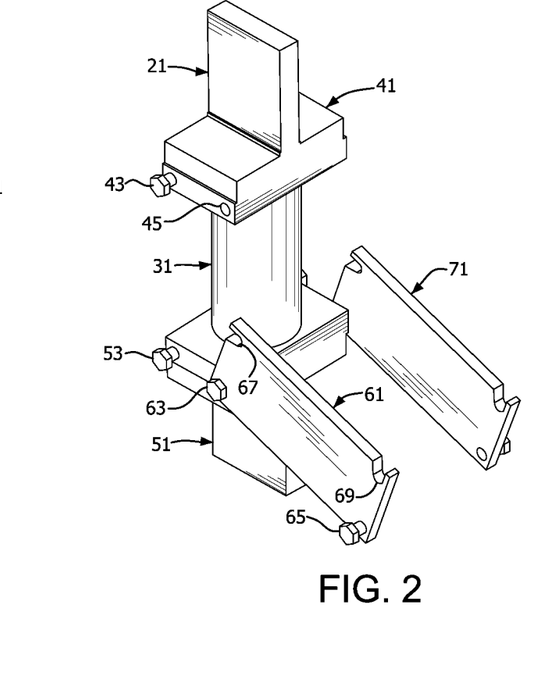
FIG. 2 is a perspective view of the high voltage test terminal of FIG. 1 in an open position.

As shown in FIGS. 1-18, a high voltage test terminal 21 for an electrical power distribution/transmission system 11 includes a shock-absorbing insulator 31 disposed between first and second conductors 41 and 51, respectively. A blade 61 is movably connected to the second conductor 51. The blade 61 is electrically and mechanically connected to the first conductor 41 in a first position, as shown in FIG. 1, and electrically isolated and mechanically disconnected from the first conductor 41 in a second position, as shown in FIG. 2. The blade 61 is in the first position (FIGS. 1 and 3), i.e., closed, for normal operation of the electrical apparatus 13. The blade 61 of the test terminal 21 is moved to the second position (FIGS. 2, 4 and 5), i.e., open to conduct both electrical and mechanical tests of the electrical apparatus 13. Existing test terminals required the blade to be returned to the closed position to conduct field mechanical testing of the electrical apparatus. Both electrical and mechanical field testing is conducted with the high-voltage test terminal according to exemplary embodiments of the present invention in an open position.

Figure 4:
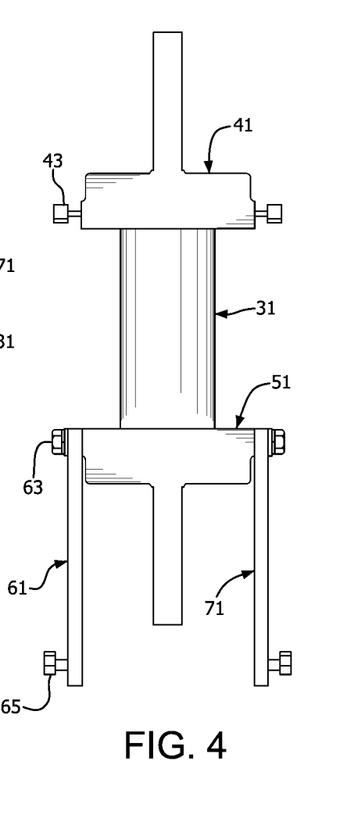
FIG. 4 is a front elevational view of the high voltage test terminal of FIG. 2.
Figure 5:
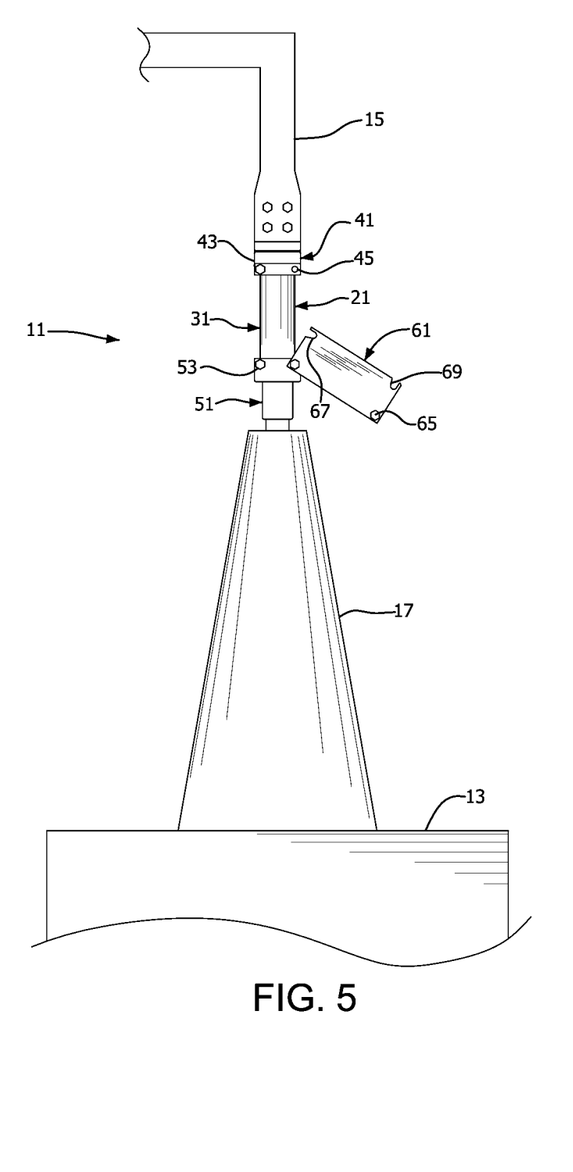
FIG. 5 is a side elevational view of the high voltage test terminal of FIG. 2. electrically connected in a power distribution/transmission system.

The test terminal 21 is disposed in the power distribution/ transmission system 11 between a high-voltage power bus 15 and a bushing 17 of the electrical apparatus 13 to be field tested, as shown in FIG. 5. With the blade 61 in the closed position (FIGS. 1 and 3) electrical power is transferred from the power bus 15 through the test terminal 21 to the electrical apparatus 13. When the blade 61 is moved to the open position, as shown in FIGS. 2, 4 and 5, electrical power is prevented from passing through the test terminal 21, thereby electrically isolating the electrical apparatus 13 for field testing.

The test terminal 21 has a first conductor 41 mechanically and electrically connected to the high-voltage power bus 15 and a second conductor 51 mechanically and electrically connected to the electrical apparatus 13. An insulator 31 is disposed between the first and second conductors 41 and 51. A first blade 61 is movably connected between the first and second conductors 41 and 51. A second blade 71 may also be movably connected between the first and second conductors 41 and 51.

Figure 16:
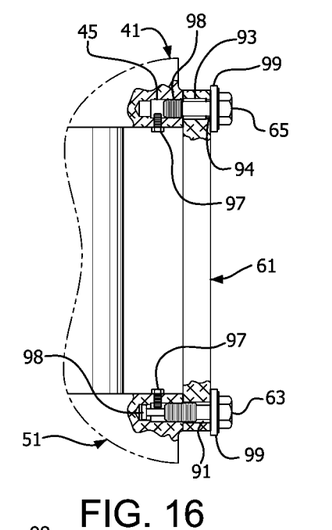
FIG. 16 is a side elevational view in partial cross section of fasteners securing a blade to a conductor.
Figure 17:
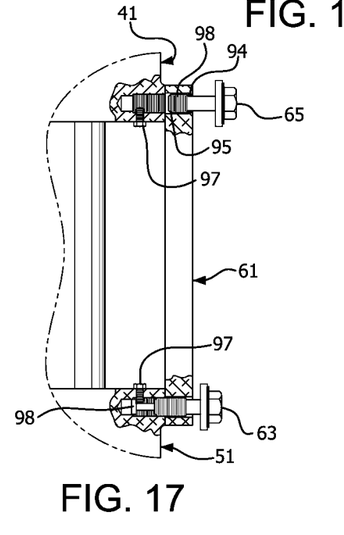
FIG. 17 is a side elevational view in partial cross section of FIG. 16 in which the fasteners are loosened.
Figure 18:
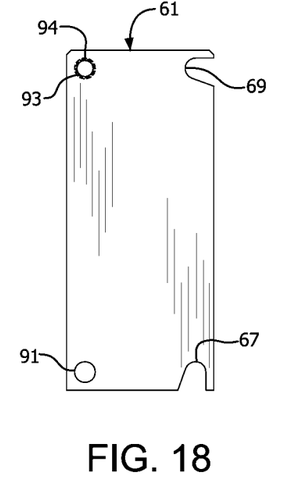
FIG. 18 is a side elevational view of a blade.

The first blade 61 has a first fastener 63 that movably and pivotally connects the first blade to the second conductor 51. As shown in FIGS. 16-18, the first fastener 63 is received by a thru hole 91 in the first blade 61 and a threaded hole 92 in the second conductor 51. A second fastener 65 secures the first blade 61 to the first conductor 41 and is received by a fastener hole 45 therein. A fastener hole 93 in the first blade 61 has a threaded portion 94 that receives the second fastener 65. A third fastener 53 connected to the second conductor 51 receives a first notch 67 in the first blade 61. A fourth fastener 43 connected to the first conductor 41 receives a second notch 69 in the first blade 61. Washers 99 may be disposed between each of the fasteners and the first blade 61, as shown in FIGS. 16 and 17. The second blade 71 is substantially similar to the first blade 61 such that the description thereof also applies to the second blade. The first and second conductors 41 and 51 and the first and second blades 61 and 71 are preferably made of aluminum or plated copper.

The shock-absorbing insulator 31 has a first end connected to the first conductor 41 and a second end connected to the second conductor 51. The insulator is made of a shock absorbing material to protect the test terminal from shocks and vibrations associated with mechanical field testing of the electrical apparatus 13. The shock absorbing insulator 31 may be made of fiberglass or epoxy-wound filament rods or tubes. The insulator ends may be connected to the first and second conductors in any suitable manner, however, several connection configurations are illustrated in the exemplary embodiments of FIGS. 6-8.

Figure 6:
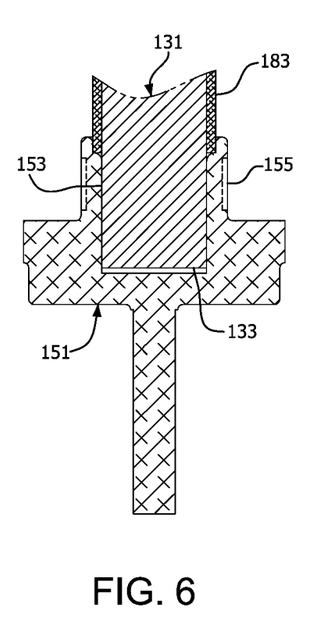
FIG. 6 is a front elevational view in cross section of the high voltage test terminal in which the insulator is crimped to the conductor according to a second exemplary embodiment of the present invention.

As shown in FIG. 6, a solid rod insulator 131 may be crimped to the second conductor 151. The second end 133 of the insulator 131 is disposed in a socket 153 in the second conductor 151. A crimping area 155 of the second conductor is crimped to secure the insulator 131 to the second conductor 151. The first end of the insulator 131 is secured to the first conductor in a substantially similar manner. A protective coating 183 may be disposed over the shock-absorbing insulator 131. The protective coating 183 protects the insulator 131 from any UV radiation or moisture ingress that might weaken the insulator, and may be made of a resin, silicone-rubber or UV resistant paint.

Figure 7:
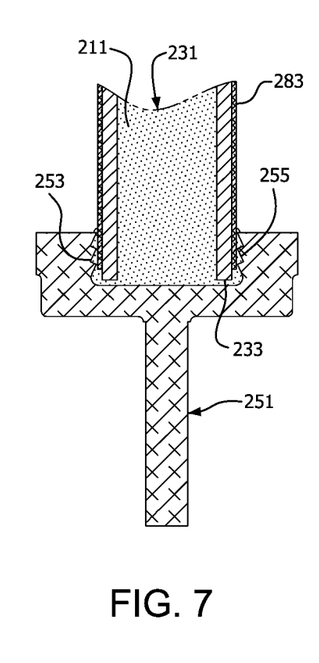
FIG. 7 is a front elevational view in cross section of the high voltage test terminal in which the insulator is secured to the conductor by an adhesive according to a third exemplary embodiment of the present invention.

As shown in FIG. 7, a hollow tube insulator 231 may be secured to the second conductor 251 with a potting compound. The second end 233 of the insulator 231 is disposed in a socket 253 in the second conductor 251. A potting compound 211 is disposed within the hollow insulator 231 to secure the insulator to the second conductor 251. A plurality of steps 255 may be formed in the socket 253 to increase the surface area of the socket, thereby increasing the bonding area of the potting compound with the conductor. Any suitable potting compound may be used. Preferably, the potting compound is an epoxy-foam, which provides additional shock absorbing capabilities to the test terminal. The first end of the insulator 231 is secured to the first conductor in a substantially similar manner. A protective coating 283 may be disposed over the shock-absorbing insulator 231.

Figure 8:
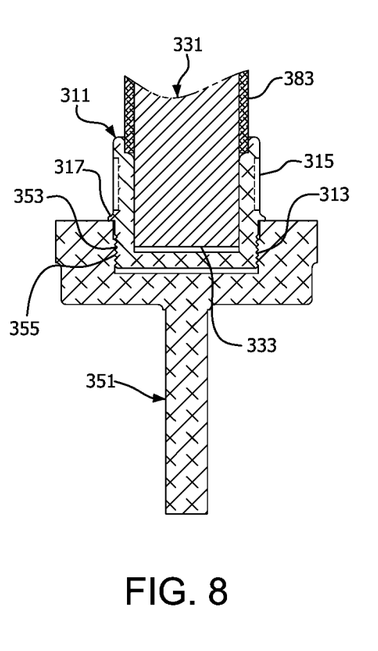
FIG. 8 is a front elevational view in cross section of the high voltage test terminal in which an end fitting secures the insulator to the conductor according to a fourth exemplary embodiment of the present invention.

As shown in FIG. 8, a solid rod insulator 331 is connected to the second conductor 351. A second end 333 of the insulator 331 is disposed in a second end cap 311, which is disposed in a socket 353 formed in the second conductor 351.

A threaded portion 313 of the end cap 311 threadably engages a threaded portion 355 of the socket 353 to secure the end cap 311 and insulator 331 to the second conductor 351. A shoulder 317 may be disposed on the end cap 311 to limit insertion of the end cap into the socket 353 of the second conductor 351. A crimping area 315 of the end cap 311 is crimped to secure the insulator 331 to the end cap 311. The first end of the insulator 331 is secured to the first conductor in a substantially similar manner. A protective coating 383 may be disposed over the shock-absorbing insulator 331.

Figure 9:
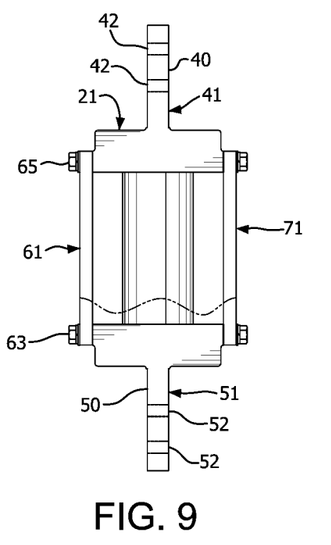
FIG. 9 is a front elevational view of the high voltage test terminal in which the conductors have fastener holes according to a fifth exemplary embodiment of the present invention.

Various configurations for connecting the conductors to the electrical power distribution/transmission system are shown in the exemplary embodiments of FIGS. 9-15, which are described with reference to the second conductor, although such configurations are applicable to the first conductor. As shown in FIG. 9, the first conductor 41 has a projection 40 having a plurality of fastener holes 42 for receiving fasteners to secure the first conductor 41 to the high-voltage bus 15. The second conductor 51 has a projection 50 having plurality of fastener holes 52 for receiving fasteners to secure the second conductor to the bushing 17 of the electrical apparatus 13.

Figure 10:
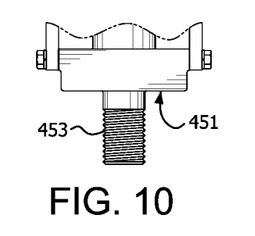
FIG. 10 is a partial front elevational view of the high voltage test terminal in which the conductor is threaded according to a sixth exemplary embodiment of the present invention.
Figure 11:
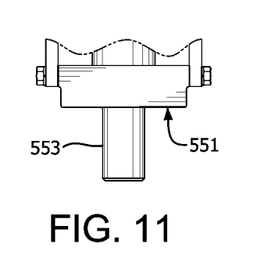
FIG. 11 is a front elevational view of the high voltage test terminal in which the conductor has a smooth projection according to a seventh exemplary embodiment of the present invention.
Figure 12:
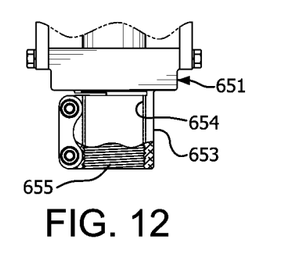
FIG. 12 is a front elevational view of the high voltage test terminal in which the conductor has a threaded socket according to an eighth exemplary embodiment of the present invention.

As shown in FIG. 10, the second conductor 451 has a threaded projection 453 for threadably engaging the test terminal. As shown in FIG. 11, the second conductor 551 has a smooth male projection 553 suitable for crimping the test terminal or providing an interference fit. As shown in FIG. 12, the second conductor 651 has a projection 653 having a socket 654 formed therein. The socket 654 has an internally threaded portion 655.

Figure 13:
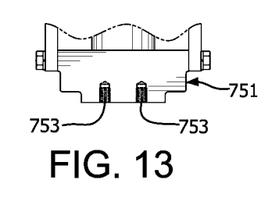
FIG. 13 is a front elevational view of the high voltage test terminal in which the conductor has tapped holes according to a ninth exemplary embodiment of the present invention.
Figure 14:
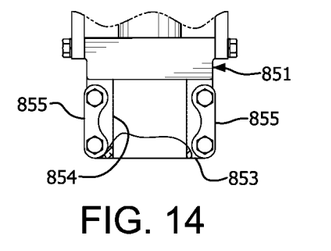
FIG. 14 is a front elevational view of the high voltage test terminal in which the conductor has a smooth socket and a clamp according to a tenth exemplary embodiment of the present invention.
Figure 15:
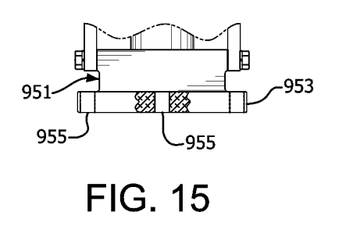
FIG. 15 is a front elevational view of the high voltage test terminal in which the conductor has through holes according to an eleventh exemplary embodiment of the present invention.

As shown in FIG. 13, the second conductor 751 has tapped holes 733 formed therein adapted to receive fasteners. As shown in FIG. 14, the second conductor 851 has a projection 853 having a socket 854 formed therein. Clamps 855 are connected to the projection 853 to facilitate securing a member received by the socket 853. As shown in FIG. 15, the second conductor 951 has a flange 953 connected thereto having a plurality of fastener holes 955 adapted to receive fasteners.

Assembly and Operation

Figure 3:
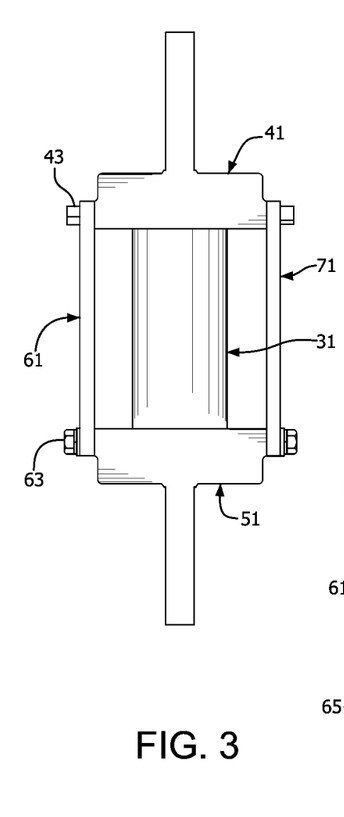
FIG. 3 is a front elevational view of the high voltage test terminal of FIG. 1.

The high-voltage test terminal 21 is shown in the closed position in FIGS. 1 and 3. The first notch 67 in the first blade 61 is received by the third fastener 53 and the second notch 69 is received by the fourth fastener 43. The second fastener 65 is inserted in the fastener hole 45 in the first conductor 41. The first, second, third and fourth fasteners 63, 65, 53 and 43 are then tightened to secure the first blade 61 to the first conductor 41. The second blade 71 is connected in a substantially similar manner to position the blades in the closed position. With the blades in the closed position the test terminal 21 is in the normal operating position such that electrical power is transferred from the power bus 15 through the test terminal 21 to the electrical apparatus 13.

To electrically isolate the electrical apparatus 13 for field testing, the blades 61 and 71 are moved to the open position, as shown in FIGS. 2, 4 and 5, thereby preventing electrical power from passing through the test terminal 21. The second fastener 65 is removed from the fastener hole 45 such that the first blade 61 may be rotated or pivoted about the first fastener 63. The second fastener 65 remains threadably engaged with the first blade 61. The third and fourth fasteners 53 and 43 are loosened such that the notches 67 and 69 in the first blade 61 allow the first blade 61 to be released from the third and fourth fasteners 53 and 43, without complete removal from the first conductor 41. The first fastener 63 is loosened such that the first blade 61 rotates about the first fastener. The second blade 71 is opened in a substantially similar manner.

The first fastener 63 preferably has a substantially T-shaped stopper portion 98 at an end thereof, as shown in FIGS. 16 and 17. The third and fourth fasteners 53 and 43 also preferably have substantially T-shaped stopper portions at ends thereof. Cap screws 97 disposed in the first and second conductors 41 and 51 prevent the fasteners 63, 43 and 53 from being removed from their respective conductors upon being loosened. The substantially T-shaped stopper portions 98 contact the cap screws 97, thereby preventing removal of the fasteners 63, 43 and 53 from their respective conductors. The first blade 61 has a thru hole 91 for receiving the first fastener 63, thereby allowing the first blade 61 to rotate about the first fastener. The second fastener 65 is received by the fastener hole 93 in the first blade 61 that has a threaded portion 94. Accordingly, when the second fastener 65 is loosened, the threaded portion 98 of the second fastener 65 engages the threaded portion 94 of the fastener hole 93, thereby preventing the second fastener from being completely removed from the first blade 61.

The blades 61 and 71 are electrically isolated and mechanically disconnected from the first conductor 41 when in the open position. With the blades 61 and 71 of the test terminal 21 in the open position both electrical and mechanical field testing of the electrical apparatus 13 may be conducted.

When the field testing is complete, the first and second blades 61 and 71 are returned to the closed position, as shown in FIGS. 1 and 3, such that the third and fourth fasteners 53 and 43 receive the notches 67 and 69, respectively. The second fastener 65 is reinserted in the fastener hole 45 in the first conductor 41. The first, second, third and fourth fasteners 63, 65, 53 and 43 are then tightened to secure the first blade 61 to the first conductor 41. The second blade 71 is secured to the first conductor 41 in a substantially similar manner. The blades 61 and 71 are then electrically and mechanically connected between the first and second conductors 41 and 51, such that electrical power is transferred through the test terminal to the electrical apparatus 13.

While a number of advantageous embodiments have been chosen to illustrate the invention, it will be understood by those skilled in the art that various changes and modifications may be made therein without departing from the scope of the invention as defined in the appended claims.

What is claimed is:

1. A high-voltage test terminal, comprising:
   a first conductor;
   a second conductor;
   a shock-absorbing insulator disposed between and coupled to said first and second conductors; and
   a blade movably connected to said second conductor, said blade being electrically and mechanically connected to said first conductor in a first position and electrically isolated and mechanically disconnected from said first conductor in a second position, a first fastener threadably connecting said blade to said first conductor in said first position and said first fastener being threadably disconnected from said first conductor and moving with said blade to said second position.

2. The high-voltage test terminal of claim 1, wherein said shock-absorbing insulator is made of fiberglass or epoxy-wound filament rods or tubes.

3. The high-voltage test terminal of claim 1, wherein said insulator is crimped to each of said first and second conductors.

4. The high-voltage test terminal of claim 1, wherein an adhesive secures said insulator to each of said first and second conductors.

5. The high-voltage test terminal of claim 4, wherein said adhesive is an epoxy-foam.

6. The high-voltage test terminal of claim 1, wherein first and second end caps are connected to first and second ends of said insulator, respectively; and
said first and second end caps are connected to said first and second conductors, respectively.

7. The high-voltage test terminal of claim 6, wherein said first and second end caps are crimped to said first and second ends, respectively, of said insulator.

8. The high-voltage test terminal of claim 6, wherein said first and second end caps are threadably engaged with said first and second conductors, respectively.

9. The high-voltage test terminal of claim 1, wherein said first fastener and at least one additional fastener releasably connects said blade to said first and second conductors.

10. The high-voltage test terminal of claim 9, wherein said first fastener and a third fasteners secure said blade to said second conductor in said closed position; and
second and fourth fasteners secure said blade to said first conductor in said closed position.

11. The high-voltage test terminal of claim 10, wherein a first notch in said first blade receives said third fastener when said blade is in said closed position; and
a second notch in said first blade receives said fourth fastener when said blade is in said closed position.

12. The high-voltage test terminal of claim 11, wherein said first notch is disengaged from said third fastener and said second notch is disengaged from said fourth fastener when said blade is in said open position.

13. A high-voltage test terminal, comprising:
a first conductor;
a second conductor;
a shock-absorbing insulator disposed between said first and second conductors; and
first and second blades movably connected to said second conductor, said first and second blades being electrically connected to said first conductor in a first position and electrically isolated and mechanically disconnected from said first conductor in a second position, a first fastener threadably connecting each of said first and second blades to said first and second conductors in said first positions and said first fasteners being threadably disconnected from said first and second conductors and moving with said first and second blades to said second positions.

14. The high-voltage test terminal of claim 13, wherein said shock-absorbing insulator is made of fiberglass or epoxy-wound filament rods or tubes.

15. The high-voltage test terminal of claim 13, wherein said insulator is a solid rod.

16. The high-voltage test terminal of claim 13, wherein said insulator is a hollow tube.

17. The high-voltage test terminal of claim 13, wherein a protective coating is disposed on the shock-absorbing layer.

18. The high-voltage test terminal of claim 17, wherein the protective coating is a resin, silicone-rubber or UV resistant paint.

19. The high-voltage test terminal of claim 13, wherein said insulator is crimped to each of said first and second conductors.

20. The high-voltage test terminal of claim 13, wherein an adhesive secures said insulator to each of said first and second conductors.

21. The high-voltage test terminal of claim 13, wherein said first fasteners and third fasteners secure each of said first and second blades to said second conductor in said closed position; and
second and fourth fasteners secure each of said first and second blades to said first conductor in said closed position.

22. The high-voltage test terminal of claim 21, wherein a first notch in each of said first and second blades receives one of said third fasteners when said first and second blades are in said closed position; and
a second notch in each of said first and second blades receives one of said fourth fasteners when said first and second blades are in said closed position.

23. The high-voltage test terminal of claim 22, wherein each of said first notches is disengaged from each of said third fasteners and each of said second notches is disengaged from each of said fourth fasteners when said first and second blades are in said open position.

24. A method of field testing electrical apparatus, comprising:
connecting a test terminal having a shock-absorbing insulator between a high voltage bus and the electrical apparatus to be tested;
positioning a blade of the test terminal in a closed position for normal operation of the electrical apparatus with a fastener connected to the blade;
moving the blade of the test terminal to an open position to electrically isolate the electrical apparatus from the high voltage bus, the fastener moving with the blade; and
conducting both electrical and mechanical tests of the electrical apparatus after moving the blade to the open position, the shock-absorbing insulator protecting the test terminal from shocks and vibrations resulting from the electrical and mechanical tests.

25. The method of field testing an electrical component of claim 24, further comprising
moving the blade to the closed position after testing is completed to return the electrical apparatus to normal operation.

* * * * *